(12) United States Patent
Satoh et al.

(10) Patent No.: US 6,441,301 B1
(45) Date of Patent: Aug. 27, 2002

(54) SOLAR CELL AND METHOD OF MANUFACTURING THE SAME

(75) Inventors: Takuya Satoh, Nara; Takayuki Negami, Osaka; Shigeo Hayashi; Yasuhiro Hashimoto, both of Kyoto; Shinichi Shimakawa, Nara, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/804,521

(22) Filed: Mar. 12, 2001

(30) Foreign Application Priority Data

Mar. 23, 2000 (JP) ......................................... 2000-082746

(51) Int. Cl.$^7$ ......................... H01L 31/06; H01L 31/18; H01L 31/0264; H01L 31/0272
(52) U.S. Cl. ................. 136/265; 136/262; 136/252; 136/256; 136/244; 438/95; 438/93
(58) Field of Search ................. 136/265, 262, 136/252, 256, 244; 438/95, 93

(56) References Cited

U.S. PATENT DOCUMENTS

| | | | |
|---|---|---|---|
| 4,309,485 A | | 1/1982 | Kondo et al. ............... 428/457 |
| 4,684,761 A | | 8/1987 | Devaney ..................... 136/258 |
| 5,500,056 A | * | 3/1996 | Wada et al. ................. 136/259 |
| 6,107,562 A | * | 8/2000 | Hashimoto et al. ......... 136/252 |

FOREIGN PATENT DOCUMENTS

| | | |
|---|---|---|
| EP | 144 055 | 6/1985 |
| JP | 57-85974 A | 5/1982 |
| JP | 60-119784 | 6/1985 |
| JP | 1-55875 | 3/1989 |
| JP | 5-129641 | 5/1993 |
| JP | 11-261090 | 9/1999 |

OTHER PUBLICATIONS

"Flexible and Light Weight Copper Indium Diselenide Solar Cells"; Bulent M. Basol et al., 25$^{th}$ PVSC, May 13–17 (1996), pp. 157–162.
"Progress Toward 20% Efficiency in Cu(In, Ga) Se$_2$ Polycrystalline Thin–film Solar Cells", Miguel A. Contreras et al., (1991), Prog. Photovolt:Res. Appl., vol. 7, pp. 311–316.

* cited by examiner

*Primary Examiner*—Alan Diamond
(74) *Attorney, Agent, or Firm*—Merchant & Gould PC

(57) ABSTRACT

A solar cell with good characteristics and high reliability is provided that includes a semiconductor comprising at least one element from each of groups Ib, IIIb, and VIb. A method of manufacturing the same also is provided. The solar cell includes a conductive base, a first insulating layer formed on one principal plane of the base, a second insulating layer formed on a second principal plane of the base, and a light-absorption layer disposed above the first insulating layer. The light-absorption layer is formed of a semiconductor comprising at least one element from each of groups Ib, IIIb, and VIb.

22 Claims, 7 Drawing Sheets

SOLAR CELL AND METHOD OF MANUFACTURING THE SAME

BACKGROUND OF THE INVENTION

1. Field of the Invention

The present invention relates generally to a solar cell with a conductive base and to a method of manufacturing the same.

2. Related Background Art

Thin-film solar cells with metal substrates can be used for various purposes due to their characteristics of using light and flexible substrates. Furthermore, the metal substrates can withstand high-temperature processing. In view of this, the improvement in conversion efficiency of the solar cells can be expected.

When using a conductive substrate, there is a problem in that it is difficult to connect a plurality of unit cells in series on the substrate and thus to obtain an integrated structure. In addition, when using a metal sheet as a substrate, a constituent element contained in the metal sheet diffuses into a light-absorption layer and thus the characteristics are deteriorated, which also is a problem. In order to solve such problems, a method has been disclosed that includes forming an insulating layer on a metal substrate and forming an electrode layer and an amorphous Si layer as a light-absorption layer thereon (for instance, JP 05(1993)-129641 A and JP 11(1999)-261090 A).

On the other hand, solar cells using semiconductors having a chalcopyrite structure, which are represented by Cu(In, Ga)Se$_2$ (hereinafter referred to as "CIGS"), for the light-absorption layer have high conversion efficiency and thus are receiving much attention. Generally, in the solar cells using CIGS, glass substrates are used as the bases. In addition, solar cells also have been reported in which polyimide or stainless steel sheets are used instead of the glass substrates for the purpose of manufacturing lightweight or flexible solar cells.

In solar cells using semiconductors (of chalcopyrite structure) including at least one element from each of groups Ib, IIIb, and VIb, further improvements in reliability and characteristics have been requested.

SUMMARY OF THE INVENTION

Therefore, with the foregoing in mind, it is an object of the present invention to provide a solar cell with good characteristics and high reliability using a semiconductor including at least one element from each of groups Ib, IIIb, and VIb, and to provide a method of manufacturing the same.

In order to achieve the above-mentioned object, a first solar cell according to the present invention includes: a conductive base; a first insulating layer formed on one principal plane of the base; a second insulating layer formed on a second principal plane of the base; and a light-absorption layer disposed above the first insulating layer. The light-absorption layer is formed of a semiconductor including at least one element from each of groups Ib, IIIb, and VIb. The first solar cell can avoid the base being embrittled by reacting with the group VIb element (particularly, Se or S) when the light-absorption layer is formed. Therefore, a solar cell with good characteristics and high reliability can be obtained. In addition, it also can be avoided that the productivity decreases due to a chalcogenide compound produced by the reaction between the group VIb element and the base. Furthermore, in the first solar cell, the insulating layer can prevent an element contained in the base from diffusing into the light-absorption layer. This effect is particularly important when the base is formed of metal.

Throughout this specification, "groups Ib, IIIb, VIb, and Ia" refer to "groups 1B, 3B, 6B, and 1A" of the periodic table of elements according to the old IUPAC recommendation before 1985. Thus, a "group Ib element", "group IIIb element", "group VIb element", and "group Ia element" denote one of a series of elements containing Cu, one of a series of elements containing Al, Ga, and In, one of a series of elements containing S, Se, and Te, and one of a series of elements containing Li, Na, and K, respectively.

The first solar cell further may include a plurality of unit cells connected in series on the first insulating layer. According to this configuration, an integrated solar cell with a large area and good characteristics can be obtained.

In the first solar cell, the base may be formed of metal, and the semiconductor may contain Cu, at least one element selected from a group consisting of In and Ga, and at least one element selected from a group consisting of Se and S. When a thin base is used in the above-mentioned configuration, a flexible solar cell can be obtained. In addition, the use of the metal base allows processing at a high temperature to be carried out and thus allows a light-absorption layer to be formed of a semiconductor with especially high crystallinity.

In the first solar cell, the base may be formed of stainless steel or an aluminum alloy. According to this configuration, a lightweight solar cell can be obtained.

The first solar cell further may include a conductive layer formed on the first insulating layer and a layer A disposed between the conductive layer and the light-absorption layer. The layer A may contain a group Ia element. According to the above-mentioned configuration, a solar cell with excellent characteristics can be obtained.

In the first solar cell, the group Ia element may be Na.

In the first solar cell, the first and second insulating layers have a mean thickness of not more than 0.5 µm. According to the configuration described above, the substrate surface is allowed to have uniform temperature distribution when the light-absorption layer is formed. In addition, the base and the conductive layer can be prevented from coming off.

In the first solar cell, the first and second insulating layers may be formed of at least one selected from a group consisting of oxide and fluoride.

In the first solar cell, the first and second insulating layers essentially may consist of silicon oxide. According to the configuration described above, the base and the conductive layer can be prevented from coming off. Furthermore, the insulating layers can be formed easily.

In the first solar cell, the first and second insulating layers essentially may consist of iron fluoride. According to this configuration, uniform insulating layers can be formed easily.

A second solar cell according to the present invention includes: a conductive base; an insulating layer formed on the base; a conductive layer formed on the insulating layer; and a light-absorption layer disposed above the conductive layer. At least one layer disposed between the base and the light-absorption layer contains a group Ia element. The light-absorption layer is formed of a semiconductor including at least one element from each of groups Ib, IIIb, and VIb. According to the second solar cell, a solar cell with good characteristics and high reliability can be obtained. Conceivably, this is because the crystallinity of the light-absorption layer is improved by the group Ia element contained in the layer disposed between the base and the light-absorption layer. Furthermore, in the second solar cell, the insulating layer can prevent an element contained in the base from diffusing into the light-absorption layer. This effect is particularly important when the base is formed of metal.

The second solar cell further may include a plurality of unit cells connected in series on the insulating layer.

In the second solar cell, the base may be formed of metal, and the semiconductor may contain Cu, at least one element selected from a group consisting of In and Ga, and at least one element selected from a group consisting of Se and S.

In the second solar cell, the base may be formed of stainless steel or an aluminum alloy.

In the second solar cell, the insulating layer may contain the group Ia element.

In the second solar cell, the insulating layer may be formed of an oxide containing Na.

In the second solar cell, the insulating layer may be formed of soda-lime glass.

In the second solar cell, the insulating layer may be formed of NaF.

The second solar cell further may include a layer B disposed between the conductive layer and the light-absorption layer. The layer B may contain a group Ia element.

In the second solar cell, the layer B may be formed of $Na_2S$ or NaF.

A method of manufacturing a solar cell with a conductive base according to the present invention includes: (i) forming, on the base, a multilayer film including a conductive layer and a layer containing a group Ia element; and (ii) forming, on the multilayer film, a light-absorption layer formed of a conductor including at least one element from each of groups Ib, IIIb, and VIb. According to the manufacturing method described above, a light-absorption layer with excellent crystallinity can be formed. Therefore, a solar cell with good characteristics and high reliability can be obtained.

In the method of manufacturing a solar cell, the base may be formed of metal, and the semiconductor may contain Cu, at least one element selected from a group consisting of In and Ga, and at least one element selected from a group consisting of Se and S.

DETAILED DESCRIPTION OF THE INVENTION

Embodiments of the present invention are described with reference to the drawings.

Embodiment 1

Figure 1:
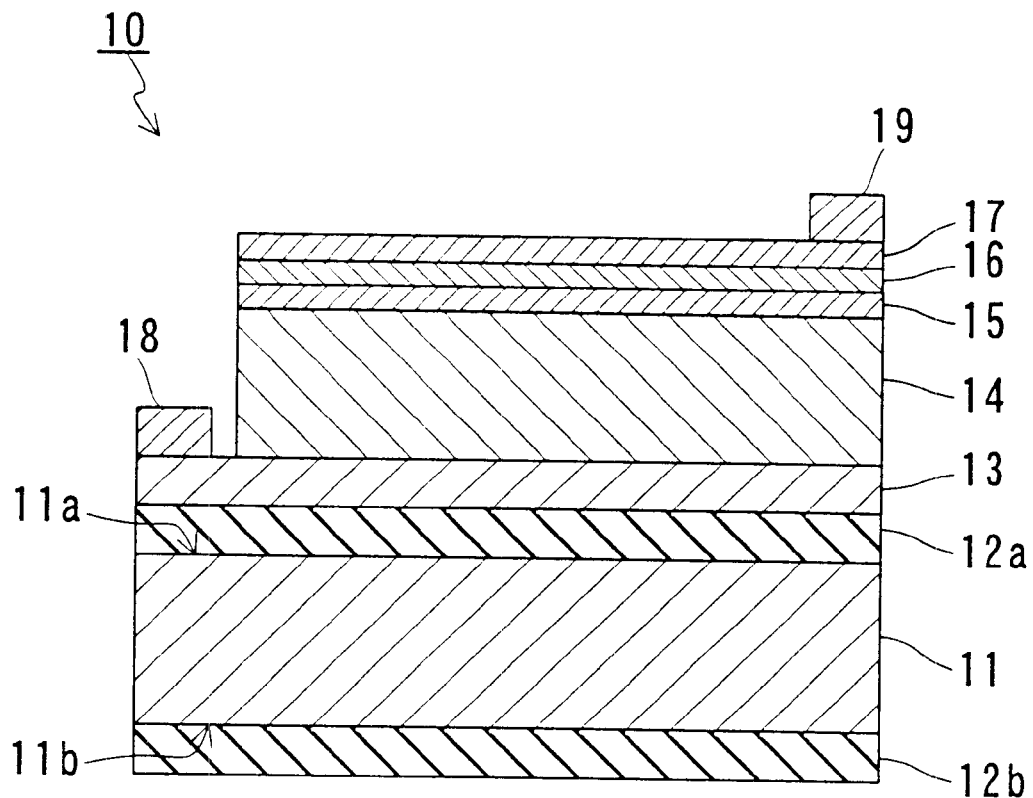
FIG. 1 is a sectional view showing an example of a solar cell according to the present invention.

In Embodiment 1, the description is directed to an example of the first solar cell according to the present invention. FIG. 1 shows a sectional view of a solar cell 10 according to Embodiment 1.

With reference to FIG. 1, the solar cell 10 includes a conductive base 11, a first insulating layer 12a formed on one principal plane 11a of the base 11, and a second insulating layer 12b formed on a second principal plane 11b of the base 11. The base 11, and the first and second insulating layers 12a and 12b constitute a substrate. The solar cell 10 further includes a conductive layer 13, a light-absorption layer, 14, a first semiconductor layer 15, a second semiconductor layer 16, and a transparent conductive layer 17, which are formed sequentially on the first insulating layer 12a. The solar cell also includes an interconnection electrode 18 formed on the conductive layer 13 and an interconnection electrode 19 formed on the transparent conductive layer 17. The first and second semiconductor layers 15 and 16 are window layers.

The base 11 is formed of a material with conductivity. Specifically, the base 11 can be made of metal, for example, stainless steel or an aluminum alloy such as duralumin. Preferably, the base 11 has flexibility. When using the base 11 having flexibility, the base 11 is prepared in a roll form and thus a solar cell can be formed continuously. Consequently, the production of the solar cell is facilitated.

The first insulating layer 12a is used for insulating the base 11 and the conductive layer 13 from each other. The first and second insulating layers 12a and 12b have a resistance of, for example, at least 1 MΩ. The first and second insulating layers 12a and 12b can be made of at least one selected from an oxide and a fluoride. Specifically, they may be formed of a material essentially consisting of silicon oxide ($SiO_2$) or iron fluoride. The first and second insulating layers 12a and 12b may be formed of a material containing a group Ia element and may be formed of, for example, an oxide of Na such as soda-lime glass, NaF, or $Na_2S$. Preferably, the first and second insulating layers 12a and 12b have a mean thickness of 0.01 μm to 0.5 μm.

The conductive layer 13 is an electrode. The conductive layer 13 can be made of metal, for example, Mo.

The light-absorption layer 14 is disposed above the first insulating layer 12a. The light-absorption layer 14 is formed of a semiconductor including at least one element from each of groups Ib, IIIb, and VIb. Specifically, a semiconductor with the same crystal structure as that of chalcopyrite can be used. More specifically, a semiconductor can be used that contains Cu, at least one element selected from the group consisting of In and Ga, and at least one element selected from the group consisting of Se and S. For instance, $CuInSe_2$, $CuIn(Se, S)_2$, $Cu(In, Ga)Se_2$, or $Cu(In, Ga)(Se, S)_2$ can be used.

The first semiconductor layer 15 can be formed of CdS or a compound containing Zn. Examples of the compound containing Zn include Zn(O, S), ZnMgO, and the like. The second semiconductor layer 16 can be formed of ZnO or a material containing ZnO. The transparent conductive layer 17 can be made of ZnO doped with a group III element such as Al or ITO (indium tin oxide). The interconnection electrodes 18 and 19 can be made of metal with high conductivity.

Figure 2:
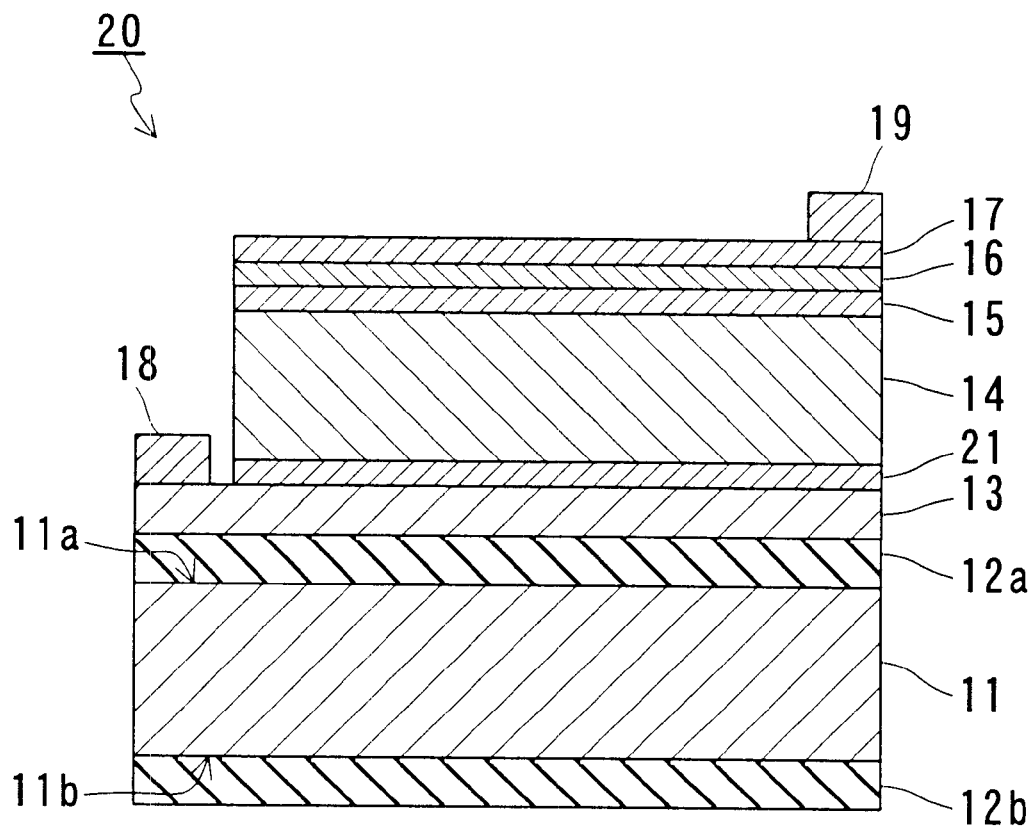
FIG. 2 is a sectional view showing another example of a solar cell according to the present invention.

The first solar cell of the present invention further may include a layer (a layer A) containing a group Ia element disposed between the conductive layer 13 and the light-absorption layer 14. FIG. 2 shows a sectional view of a solar cell 20 with a layer 21 (the layer A) containing a group Ia element. The solar cell 20 is identical with the solar cell 10 except for including the layer 21 disposed between the conductive layer 13 and the light-absorption layer 14.

Examples of the group Ia element contained in the layer 21 include Na, K, and Li. The layer 21 can be made of, for example, a compound containing Na. For example, $Na_2S$ or NaF can be used as the compound containing Na. The mean thickness of the layer 21 is, for example, in the range of 0.001 μm to 0.1 μm.

The solar cells 10 and 20 are examples of the first solar cell according to the present invention. The first solar cell according to the present invention is not limited to the solar cells 10 and 20. For instance, the second semiconductor layer 16 may be omitted. In addition, the first solar cell of the present invention may include a plurality of unit cells connected in series on the first insulating layer 12a as described in Example 3 later.

Embodiment 2

Figure 3:
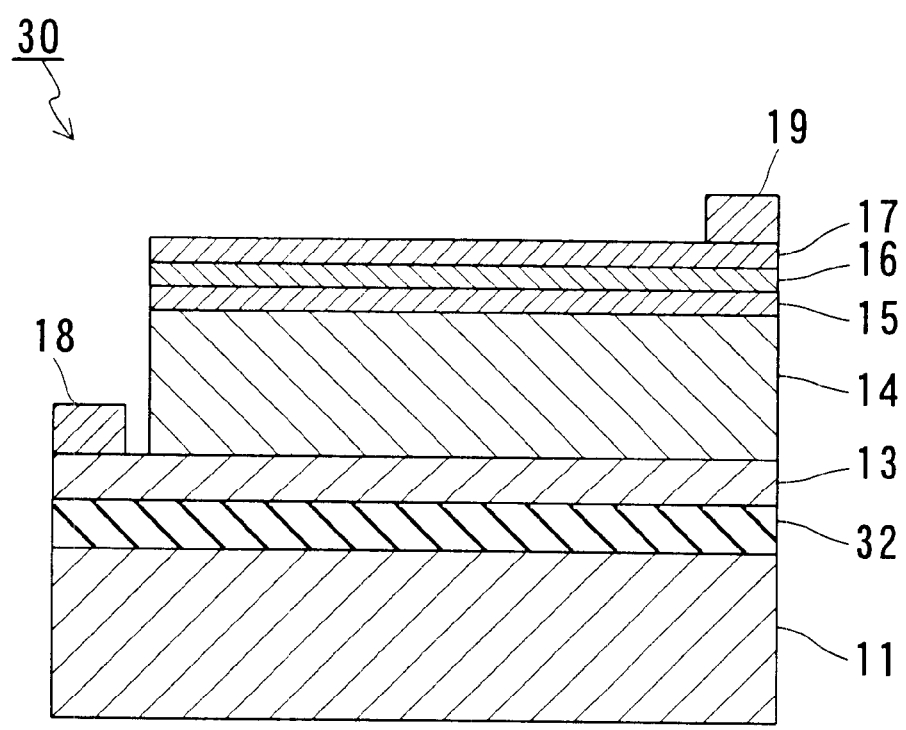
FIG. 3 is a sectional view showing still another example of a solar cell according to the present invention.

In Embodiment 2, the description is directed to an example of the second solar cell according to the present invention. FIG. 3 shows a sectional view of a solar cell 30 according to Embodiment 2. Parts identical with those in Embodiment 1 are indicated with the same reference numbers and the duplicate descriptions will be omitted.

With reference to FIG. 3, the solar cell 30 includes a base 11 and an insulating layer 32 formed on the base 11. The base 11 and the insulating layer 32 constitute a substrate. The solar cell 30 further includes: a conductive layer 13, a light-absorption layer 14, a first semiconductor layer 15, a second semiconductor layer 16, and a transparent conductive layer 17, which are sequentially formed on the insulating layer 32; an interconnection electrode 18 formed on the conductive layer 13; and an interconnection electrode 19 formed on the transparent conductive layer 17. The light-absorption layer 14 is disposed above the insulating layer 32.

The insulating layer 32 is used for insulating the base 11 and the conductive layer 13 from each other. The insulating layer 32 has a resistance of, for example, at least 1 MΩ. The insulating layer 32 can be made of an insulating material containing a group Ia element, for example, oxide or fluoride of a group Ia element. Specifically, the insulating layer 32 can be made of an oxide containing Na such as soda-lime glass. Furthermore, the insulating layer 32 may be formed using NaF.

In the solar cell 30, at least one layer disposed between the base 11 and the light-absorption layer 14 contains a group Ia element (preferably, Na). For example, the insulating layer 32 may contain a group Ia element, or may be formed of an oxide containing Na. Specifically, the insulating layer 32 may be formed of soda-lime glass.

Figure 4:
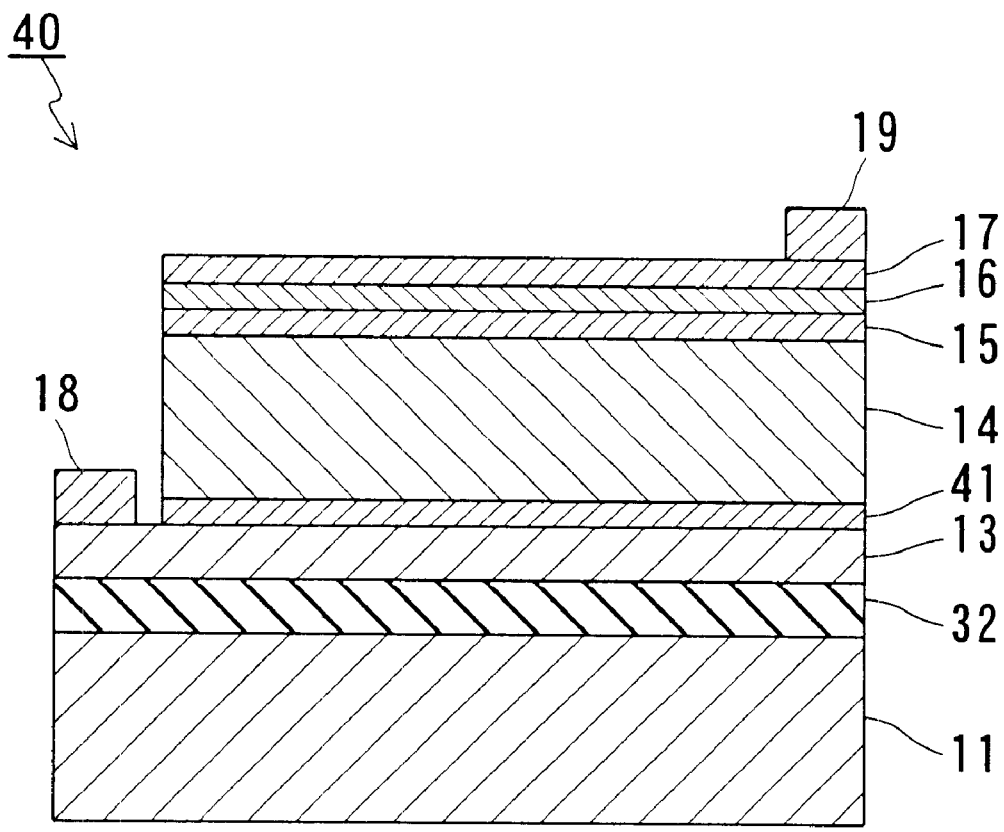
FIG. 4 is a sectional view showing yet another example of a solar cell according to the present invention.
Figure 5A:
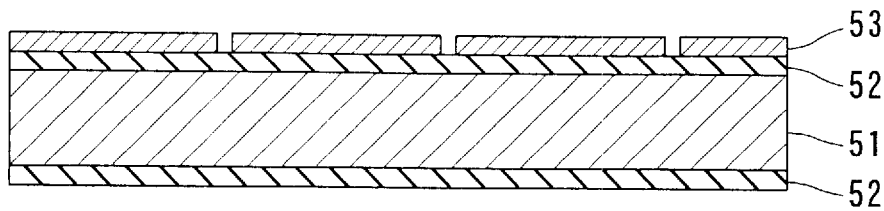
FIGS. 5A to 5E illustrate steps in an example of a method of manufacturing a solar cell according to the present invention.
Figure 5B:
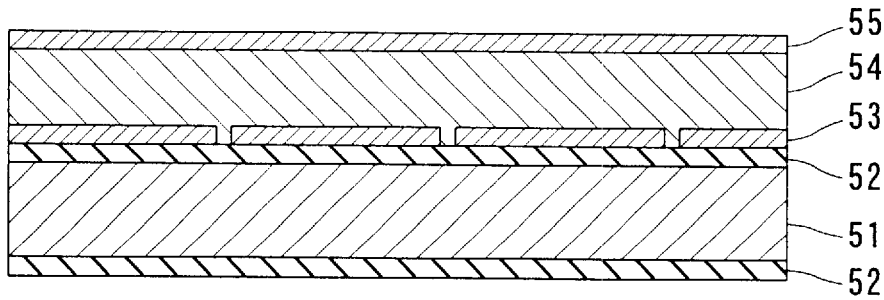
Figure 5C:
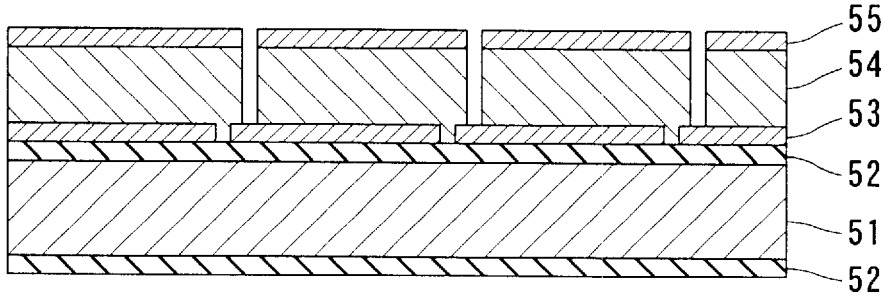
Figure 5D:
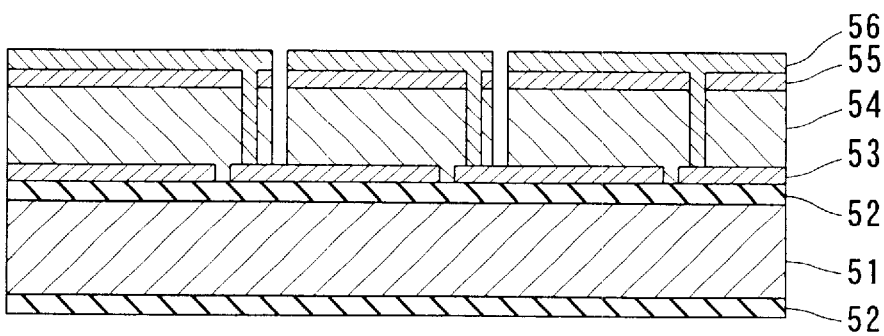
Figure 5E:
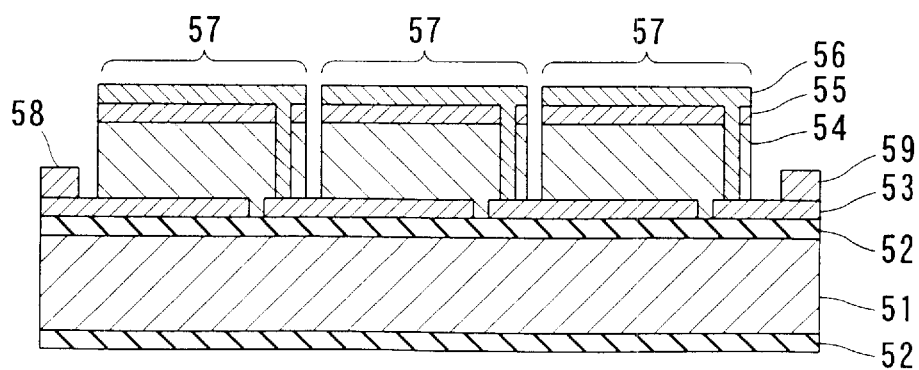

The second solar cell of the present invention further may include a layer containing a group Ia element (a layer B) disposed between the conductive layer 13 and the light-absorption layer 14. FIG. 4 shows a sectional view of a solar cell 40 with a layer 41 (the layer B) containing a group Ia element. The solar cell 40 is different from the solar cell 30 only in having the layer 41. The layer 41 contains a group Ia element and is formed of, for example, $Na_2S$ or NaF. In the solar cell 40, the layer 41 is disposed between the conductive layer 13 and the light-absorption layer 14. The layer 41 may be disposed between the conductive layer 13 and the insulating layer 32.

The solar cells 30 and 40 are examples of the second solar cell according to the present invention. The second solar cell of the present invention is not limited to the solar cells 30 and 40. For instance, the second semiconductor layer 16 may be omitted. In addition, the second solar cell of the present invention may include a plurality of unit cells connected in series on the insulating layer 32 as described in Example 6 later. Moreover, as in the solar cells described in Embodiment 1, the insulating layer 32 may be formed on both sides of the base 11.

Embodiment 3

In Embodiment 3, the description is directed to a method of manufacturing a solar cell according to the present invention. According to the manufacturing method of Embodiment 3, the solar cells according to Embodiment 2 can be manufactured. In Embodiment 3, parts identical with those described in Embodiments 1 and 2 are indicated with the same reference numbers and the duplicate descriptions will be omitted.

Initially, a multilayer film including a conductive layer and a layer containing a group Ia element is formed on a conductive base 11 (Step (i)). The multilayer film can be formed of, for example, the insulating layer 32 and the conductive layer 13 shown in FIG. 3. The multilayer film also can be formed of the insulating layer 32, the conductive layer 13, and the layer 41 shown in FIG. 4. These layers can be formed by vapor deposition or sputtering.

Next, a light-absorption layer 14 is formed on the multilayer film (step (ii)). The light-absorption layer is formed of a semiconductor including at least one element from each of groups Ib, IIIb, and VIb. This light-absorption layer can be formed by the vapor deposition described in the examples later.

Next, a first semiconductor layer 15, a second semiconductor layer 16, and a transparent conductive layer 17 are formed sequentially. These layers can be formed by vapor deposition or sputtering. As the last step, the interconnection electrodes 18 and 19 are formed. Thus, a solar cell can be obtained.

An integrated solar cell can be manufactured by the methods described in Examples 3 and 6 later.

EXAMPLES

The present invention is described further in detail by means of examples as follows. In the following examples, a stainless steel sheet is used as a base, but a base formed of an aluminum compound such as duralumin also may be used.

Example 1

In Example 1, the description is directed to an example of producing the solar cell 10 according to Embodiment 1.

Initially, a flexible stainless steel sheet with a thickness of 100 μm was prepared as the base 11. Next, $SiO_2$ layers (the first and second insulating layers 12a and 12b) were formed on both sides of the stainless steel sheet by a dip coating method. Then, a Mo layer (the conductive layer 13) was formed on one $SiO_2$ layer by RF sputtering. The thicknesses of the $SiO_2$ layers and the Mo layer were set to be 0.5 μm and 0.4 μm, respectively.

Next, a $Cu(In, Ga)Se_2$ layer (the light-absorption layer 14) was formed by the following method.

First, In, Ga, and Se were deposited on the Mo layer while their pressures were controlled with an ionization vacuum gage. In this case, the substrate temperature was set to be 350° C. During the deposition, the pressures of Se, In, and Ga were set to be $2.66 \times 10^{-3}$ Pa ($2 \times 10^{-5}$ Torr), $1.064 \times 10^{-4}$ Pa ($8 \times 10^{-7}$ Torr), and $3.99 \times 10^{-5}$ Pa ($3 \times 10^{-7}$ Torr), respectively. Afterward, the substrate temperature was increased to 600° C., and then Se and Cu were deposited under conditions allowing the pressures of Se and Cu to be set to $2.66 \times 10^{-3}$ Pa ($2 \times 10^{-5}$ Torr) and $3.99 \times 10^{-5}$ Pa ($3 \times 10^{-7}$ Torr), respectively. Then, In, Ga, and Se were deposited while the substrate temperature was maintained at 600° C. Thus, a $Cu(In, Ga)Se_2$ layer was formed.

Next, a CdS layer (the first semiconductor layer 15) was formed on the $Cu(In, Ga)Se_2$ layer by a chemical bath deposition process. Thus, a pn-junction was formed. Subsequently, a ZnO layer (the second semiconductor layer 16) and an ITO layer (the transparent conductive layer 17) were formed sequentially by sputtering. As the last step, interconnection electrodes made of Au were formed. Thus, a solar cell according to Embodiment 1 was produced.

With respect to this solar cell, its characteristics were measured using artificial sunlight of 100 mW/cm² and air mass (AM) 1.5. As a result, the solar cell obtained in the present example had a short-circuit current density of 32.3 mA/cm², an open circuit voltage of 0.610V, a fill factor of 0.750, and a conversion efficiency of 14.8%.

Thus, the solar cell according to Example 1 exhibited excellent characteristics. In this example, the $SiO_2$ layers as the insulating layers were formed on both sides of the stainless steel sheet, so that the reaction between the Se vapor and the stainless steel sheet (the base) was prevented from occurring during the formation of the $Cu(In, Ga)Se_2$ layer. In addition, the stainless steel sheet was prevented from being corroded when dipped in an alkaline aqueous solution during the formation of the CdS layer by the chemical bath deposition process. As a result, the solar cell was prevented from being damaged or degraded in flexibility caused by the deterioration of the stainless steel sheet.

Example 2

In Example 2, the description is directed to an example of producing the solar cell 20 according to Embodiment 1.

Initially, a flexible stainless steel sheet (with a thickness of 100 $\mu$m) was prepared as the base 11. Next, the stainless steel sheet was treated in a fluorine gas atmosphere with heat. Thus, iron fluoride layers (the first and second insulating layers 12a and 12b) were formed on both sides of the stainless steel sheet. The thickness of the iron fluoride layers was set to be 0.2 $\mu$m. Then, a Mo layer (with a thickness of 0.8 $\mu$m) was formed on one iron fluoride layer as the conductive layer 13 by RF magnetron sputtering.

Next, as the layer 21, a $Na_2S$ layer was formed on the Mo layer. The $Na_2S$ layer was formed by vapor deposition.

Then, a $Cu(In, Ga)Se_2$ layer, a CdS layer, a ZnO layer, an ITO layer, and interconnection electrodes were formed by the same method as in Example 1. Thus, a solar cell according to Embodiment 1 was produced. On the other hand, a solar cell including no $Na_2S$ layer also was produced by the same method as in the above.

With respect to these two solar cells, their characteristics were measured using artificial sunlight of 100 mW/cm$^2$ and AM 1.5. The measurement results are shown in Table 1.

TABLE 1

|  | $Na_2S$ Layer | |
| --- | --- | --- |
|  | Present | Absent |
| Area (cm$^2$) | 0.96 | 0.96 |
| Short-Circuit Current Density (mA/cm$^2$) | 32.3 | 32.4 |
| Open Circuit Voltage (V) | 0.615 | 0.592 |
| Fill Factor | 0.752 | 0.740 |
| Conversion Efficiency (%) | 14.9 | 14.2 |

As is apparent from Table 1, the formation of the $Na_2S$ layer allowed a solar cell with excellent characteristics to be obtained. In addition, iron fluoride layers were formed on both sides of the stainless steel sheet as in Example 1, so that the base was prevented from deteriorating and being corroded due to the Se vapor or the alkaline aqueous solution. As a result, the solar cell was prevented from being damaged or being degraded in flexibility.

Example 3

In Example 3, another example of producing a solar cell according to Embodiment 1 is described with reference to FIGS. 5A to 5E. In Example 3, an integrated solar cell was produced. FIGS. 5A to 5E show sectional views illustrating manufacturing steps.

Initially, a flexible stainless steel sheet 51 (with a thickness of 100 $\mu$m) was prepared as the base 11. Next, the stainless steel sheet 51 was treated in a fluorine gas atmosphere with heat. Thus, iron fluoride layers 52 (the first and second insulating layers 12a and 12b) were formed on both sides of the stainless steel sheet 51. The thickness of the iron fluoride layers 52 was set to be 0.2 $\mu$m. Then, a Mo layer 53 (with a thickness of 0.8 $\mu$m) was formed on one iron fluoride layer as the conductive layer 13 by RF magnetron sputtering.

Figure 6:
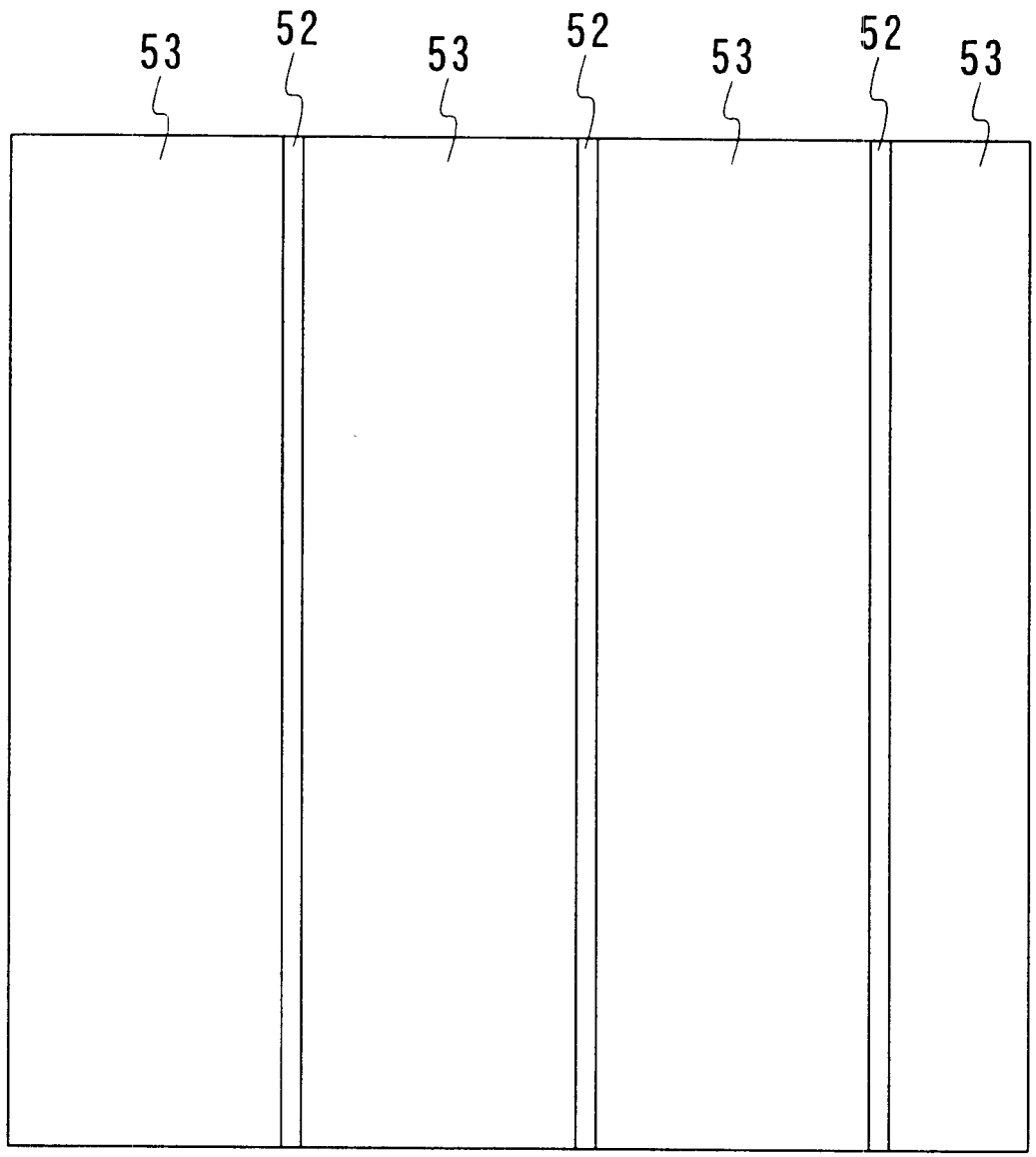
FIG. 6 is a plan view illustrating the step shown in FIG. 6A.

Next, stripe-like portions of the Mo layer 53 were removed using a Nd:YAG laser. Thus, the Mo layer 53 was divided into a plurality of strip-like portions (see FIG. 5A). FIG. 6 shows a plan view illustrating this state of the Mo layer 53.

Then, a $Cu(In, Ga)Se_2$ layer 54 was formed as the light-absorption layer by the same method as in Example 1. Furthermore, a CdS layer 55 (the first semiconductor layer 15) was formed on the $Cu(In, Ga)Se_2$ layer 54. Thus a pn-junction was produced (see FIG. 5B).

As a next step, stripe-like portions of the $Cu(In, Ga)Se_2$ layer 54 and the CdS layer 55 located directly beside and in parallel to the stripe-like portions of the Mo layer 53 that have been removed were removed by a mechanical scribing technique. Consequently, the $Cu(In, Ga)Se_2$ layer 54 and the CdS layer 55 were divided into a plurality of strip-like portions (see FIG. 5C).

Next, a multilayer film 56 including a ZnO layer (the second semiconductor layer 16) and an ITO layer (the transparent conductive layer 17) was formed by sputtering. Then, stripe-like portions of the multilayer film 56, the $Cu(In, Ga)Se_2$ layer 54 and the CdS layer 55 were removed by the mechanical scribing technique (see FIG. 5D). Specifically, their stripe-like portions located directly beside and in parallel to the stripe-like portions of the $Cu(In, Ga)Se_2$ layer 54 and the CdS layer 55 removed in the step shown in FIG. 5C were removed. Consequently, a plurality of unit cells 57 connected in series were formed on the insulating layer 52.

Finally, the interconnection electrodes 58 and 59 were formed. Thus, a solar cell with an integrated structure was produced (see FIG. 5E).

In addition, a solar cell with a non-integrated structure also was produced. With respect to these two solar cells, their characteristics were measured using artificial sunlight of 100 mW/cm$^2$ and AM 1.5. The measurement results are shown in Table 2.

TABLE 2

|  | Integrated | Non-Integrated |
| --- | --- | --- |
| Area (cm$^2$) | 4.1 | 4.1 |
| Short-Circuit Current (mA) | 40.4 | 138 |
| Open Circuit Voltage (V) | 1.926 | 0.601 |
| Fill Factor | 0.640 | 0.622 |
| Conversion Efficiency (%) | 12.2 | 12.6 |

As is apparent from Table 2, the unit cells connected in series allow a solar cell with a high output voltage to be obtained. In addition, when a metal base is used, the substrate has a uniform temperature and therefore a uniform light-absorption layer formed of a crystalline semiconductor can be formed even for a large area. Since the solar cell produced in the present example has a relatively small area, the conversion efficiency of the integrated solar cell shown in Table 2 is somewhat low. However, when considerations are given to the loss due to electrode resistance or an area loss due to a bus bar, the larger the area of the solar cell is, the more the integrated structure is advantageous.

Example 4

In Example 4, the description is directed to an example of producing the solar cell 30 described in Embodiment 2.

Initially, a flexible stainless steel sheet (with a thickness of 100 $\mu$m) was prepared as the base 11. Next, a soda-lime glass layer (the insulating layer 32) and a Mo layer (the conductive layer 13) were formed sequentially on one surface of the stainless steel sheet by RF magnetron sputtering. The thicknesses of the soda-lime glass layer and the Mo layer were set to be 0.5 $\mu$m and 1 $\mu$m, respectively.

Next, a Cu(In, Ga)Se$_2$ layer, a CdS layer, a ZnO layer, an ITO layer, and interconnection electrodes were formed by the same method as in Example 1. Thus, the solar cell according to Embodiment 2 was produced.

On the other hand, a solar cell also was produced using an Al$_2$O$_3$ layer instead of the soda-lime glass layer by the same method as in the above. With respect to these two solar cells, their characteristics were measured using artificial sunlight of 100 mW/cm$^2$ and AM 1.5. The measurement results are shown in Table 3.

TABLE 3

| | Material of Insulating Layer | |
| --- | --- | --- |
| | Soda-Lime Glass | Al$_2$O$_3$ |
| Area (cm$^2$) | 0.96 | 0.96 |
| Short-Circuit Current Density (mA/cm$^2$) | 32.3 | 32.4 |
| Open Circuit Voltage (V) | 0.610 | 0.592 |
| Fill Factor | 0.750 | 0.740 |
| Conversion Efficiency (%) | 14.8 | 14.2 |

As is apparent from Table 3, the use of the insulating layer containing a group Ia element allowed a solar cell with good characteristics to be obtained.

Example 5

An example of producing the solar cell 40 according to Embodiment 2 is described in Example 5.

Initially, a flexible stainless steel sheet (with a thickness of 100 $\mu$m) was prepared as the base 11. Next, an Al$_2$O$_3$ layer (the insulating layer 32) was formed on one surface of the stainless steel sheet by RF magnetron sputtering. The thickness of the Al$_2$O$_3$ layer was set to be 0.5 $\mu$m. Then, a Mo layer (with a thickness of 1 $\mu$m) was formed as the conductive layer 13 by RF magnetron sputtering.

Then, a Na$_2$S layer as the layer 41 was formed on the Mo layer. The Na$_2$S layer was formed by vapor deposition.

Subsequently, a Cu(In, Ga)Se$_2$ layer, a CdS layer, a ZnO layer, an ITO layer, and interconnection electrodes were formed by the same method as in Example 1. Thus, the solar cell according to Embodiment 2 was produced.

On the other hand, a solar cell including no Na$_2$S layer also was produced by the same method as in the above. With respect to these two solar cells, their characteristics were measured using artificial sunlight of 100 mW/cm$^2$ and AM 1.5. The measurement results are shown in Table 4.

TABLE 4

| | Na$_2$S Layer | |
| --- | --- | --- |
| | Present | Absent |
| Area (cm$^2$) | 0.96 | 0.96 |
| Short-Circuit Current Density (mA/cm$^2$) | 32.3 | 32.4 |
| Open Circuit Voltage (V) | 0.615 | 0.592 |
| Fill Factor | 0.752 | 0.740 |
| Conversion Efficiency (%) | 14.9 | 14.2 |

As is apparent from Table 4, the formation of the Na$_2$S layer allowed a solar cell with good characteristics to be obtained.

Example 6

In Example 6, another example of producing a solar cell according to Embodiment 2 is described with reference to FIGS. 7A to 7E. In Example 6, an integrated solar cell was produced. FIGS. 7A to 7E show sectional views illustrating manufacturing steps.

Initially, a flexible stainless steel sheet 71 (with a thickness of 100 $\mu$m) was prepared as the base 11. Next, an Al$_2$O$_3$ layer 72 (the insulating layer 32) and a Mo layer 73 (the conductive layer 13) were formed sequentially on one surface of the stainless steel sheet 71 by RF magnetron sputtering. The thicknesses of the Al$_2$O$_3$ layer 72 and the Mo layer 73 were set to be 0.5 $\mu$m and 1 $\mu$m, respectively.

Then, stripe-like portions of the Mo layer 73 were removed. Thus, the Mo layer 73 was divided into a plurality of strip-like portions (see FIG. 7A).

Figure 7A:
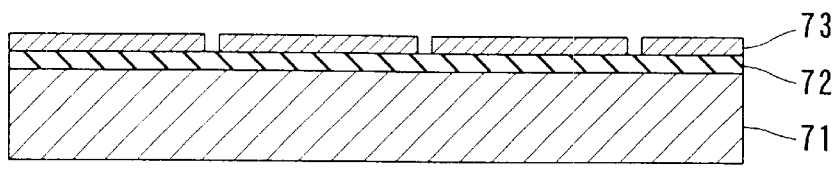
FIGS. 7A to 7E illustrate steps in another example of a method of manufacturing a solar cell according to the present invention.
Figure 7B:
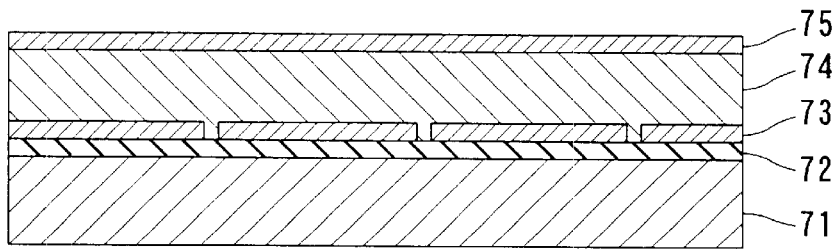
Figure 7C:
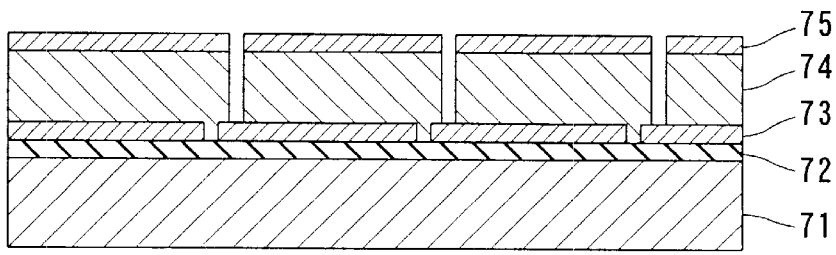
Figure 7D:
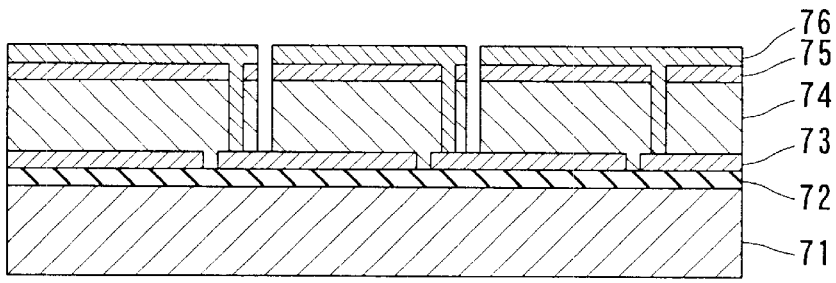
Figure 7E:
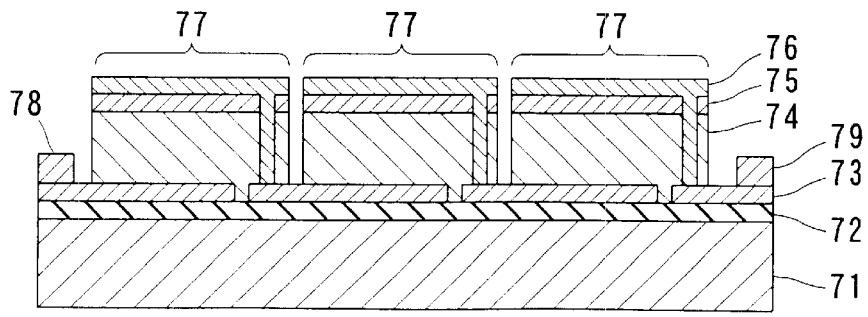

Subsequently, a Cu(In, Ga)Se$_2$ layer 74 and a CdS layer 75 were formed (see FIG. 7B). Then, the Cu(In, Ga)Se$_2$ layer 74 and the CdS layer 75 were divided into a plurality of strip-like portions (see FIG. 7C).

Next, a multilayer film 76 including a ZnO layer (the second semiconductor layer 16) and an ITO layer (the transparent conductive layer 17) was formed. Then, stripe-like portions of the multilayer film 76, the Cu(In, Ga)Se$_2$ layer 74 and the CdS layer 75 were removed (see FIG. 7D). Consequently, a plurality of unit cells 77 connected in series were formed on the stainless steel sheet 71 as the base.

Finally, the interconnection electrodes 78 and 79 were formed. Thus, a solar cell with an integrated structure was produced (see FIG. 7E). The steps shown in FIGS. 7A to 7E were carried out by the same methods as in the steps shown in FIGS. 5A to 5E.

The characteristics of the solar cell produced by the above-mentioned manufacturing method were measured. As a result, excellent characteristics were obtained as in the solar cell of Example 3.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solar cell, comprising:
   a flexible conductive base;
   a first insulating layer formed on one principal plane of the flexible conductive base;
   a second insulating layer formed on a second principal plane of the flexible conductive base; and
   a light-absorption layer disposed above the first insulating layer,
   wherein the light-absorption layer is formed of a semiconductor comprising at least one element from each of groups Ib, IIIb, and VIb.

2. The solar cell according to claim 1, further comprising a plurality of unit cells connected in series on the first insulating layer.

3. The solar cell according to claim 1, wherein the flexible conductive base is formed of metal, and
   the semiconductor contains Cu, at least one element selected from the group consisting of In and Ga, and at least one element selected from the group consisting of Se and S.

4. The solar cell according to claim 3, wherein the flexible conductive base is formed of stainless steel or an aluminum alloy.

5. The solar cell according to claim 1, further comprising:
a conductive layer formed on the first insulating layer; and
a layer A disposed between the conductive layer and the light-absorption layer,
wherein the layer A comprises a group Ia element.

6. The solar cell according to claim 5, wherein the group Ia element is Na.

7. The solar cell according to claim 1, wherein the first and second insulating layers have a mean thickness of not more than 0.5 μm.

8. The solar cell according to claim 1, wherein the first and second insulating layers are formed of at least one selected from the group consisting of oxide and fluoride.

9. The solar cell according to claim 8, wherein the first and second insulating layers consist essentially of silicon oxide.

10. The solar cell according to claim 8, wherein the first and second insulating layers consist essentially of iron fluoride.

11. A solar cell, comprising:
a flexible conductive base;
an insulating layer formed on the flexible conductive base;
a conductive layer formed on the insulating layer; and
a light-absorption layer disposed above the conductive layer,
wherein at least one layer disposed between the flexible conductive base and the light-absorption layer comprises a group Ia element, and
the light-absorption layer is formed of a semiconductor comprising at least one element from each of groups Ib, IIIb, and VIb.

12. The solar cell according to claim 11, further comprising a plurality of unit cells connected in series on the insulating layer.

13. The solar cell according to claim 11, wherein the flexible conductive base is formed of metal, and the semiconductor contains Cu, at least one element selected from the group consisting of In and Ga, and at least one element selected from the group consisting of Se and S.

14. The solar cell according to claim 13, wherein the flexible conductive base is formed of stainless steel or an aluminum alloy.

15. The solar cell according to claim 11, wherein the insulating layer comprises the group Ia element.

16. The solar cell according to claim 15, wherein the insulating layer is formed of an oxide containing Na.

17. The solar cell according to claim 16, wherein the insulating layer is formed of soda-lime glass.

18. The solar cell according to claim 15, wherein the insulating layer is formed of NaF.

19. The solar cell according to claim 11, further comprising a layer B disposed between the conductive layer and the light-absorption layer,
wherein the layer B comprises a group Ia element.

20. The solar cell according to claim 19, wherein the layer B is formed of $Na_2S$ or NaF.

21. A method of manufacturing a solar cell with a flexible conductive base, comprising:
(i) forming, on the flexible conductive base, a multilayer film including a conductive layer and a layer comprising a group Ia element; and
(ii) forming, on the multilayer film, a light-absorption layer formed of a conductor comprising at least one element from each of groups Ib, IIIb, and VIb.

22. The method of manufacturing a solar cell according to claim 21, wherein the flexible conductive base is formed of metal, and
the semiconductor contains Cu, at least one element selected from the group consisting of In and Ga, and at least one element selected from the group consisting of Se and S.

* * * * *

UNITED STATES PATENT AND TRADEMARK OFFICE
CERTIFICATE OF CORRECTION

PATENT NO.     : 6,441,301 B1
DATED          : August 27, 2002
INVENTOR(S)    : Satoh et al.

It is certified that error appears in the above-identified patent and that said Letters Patent is hereby corrected as shown below:

<u>Column 12,</u>
Line 24, "la element" should read -- Ia element --

Signed and Sealed this

Ninth Day of September, 2003

JAMES E. ROGAN
*Director of the United States Patent and Trademark Office*